US009281190B2

(12) United States Patent
Chiang et al.

(10) Patent No.: US 9,281,190 B2
(45) Date of Patent: Mar. 8, 2016

(54) LOCAL AND GLOBAL REDUCTION OF CRITICAL DIMENSION (CD) ASYMMETRY IN ETCH PROCESSING

(71) Applicants: Kang-lie Chiang, San Jose, CA (US); Olivier Luere, Sunnyvale, CA (US); Jinhan Choi, San Ramon, CA (US)

(72) Inventors: Kang-lie Chiang, San Jose, CA (US); Olivier Luere, Sunnyvale, CA (US); Jinhan Choi, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/198,304

(22) Filed: Mar. 5, 2014

(65) Prior Publication Data

US 2014/0273466 A1    Sep. 18, 2014

Related U.S. Application Data

(60) Provisional application No. 61/779,088, filed on Mar. 13, 2013.

(51) Int. Cl.
*H01L 21/311*    (2006.01)
*H01L 21/027*    (2006.01)
*H01L 21/3065*    (2006.01)

(52) U.S. Cl.
CPC ........ *H01L 21/0273* (2013.01); *H01L 21/3065* (2013.01); *H01L 21/31138* (2013.01); *H01L 21/31144* (2013.01)

(58) Field of Classification Search
CPC .................. H01L 21/3065; H01L 21/0273
USPC .............................................. 38/701; 438/701
See application file for complete search history.

(56) References Cited

U.S. PATENT DOCUMENTS

| 7,955,516 | B2* | 6/2011 | Chandrachood et al. | 216/67 |
| 2004/0053484 | A1* | 3/2004 | Kumar et al. | 438/585 |
| 2005/0064719 | A1* | 3/2005 | Liu et al. | 438/725 |
| 2006/0021702 | A1* | 2/2006 | Kumar et al. | 156/345.32 |
| 2009/0035584 | A1* | 2/2009 | Tran et al. | 428/446 |
| 2015/0132971 | A1* | 5/2015 | Lin et al. | 438/725 |

* cited by examiner

*Primary Examiner* — David S Blum
(74) *Attorney, Agent, or Firm* — Blakely Sokoloff Taylor Zafman LLP (57) ABSTRACT

Local and global reduction of critical dimension (CD) asymmetry in etch processing is described. In an example, a method of etching a wafer of to form a plurality of staircase structures with reduced local and global asymmetry involves forming a photoresist layer on a plurality of micron-scale semiconductor structures. The photoresist layer is then trimmed with a high pressure and pulsed plasma etch process performed in a reverse MESA mode.

8 Claims, 9 Drawing Sheets

| Step CD | $CD_n$ | $CD_1$ | $CD_n$-$CD_1$ |
|---|---|---|---|
| AVERAGE (nm) | 607.6 | 608.4 | -0.8 |
| 3SIGMA (nm) | 21.5 | 14.0 | 23.1 |
| Max (nm) | 622.0 | 615.7 | 14.7 |
| Min (nm) | 593.9 | 592.3 | -16.8 |
| RANGE (nm) | 28.1 | 23.4 | 31.5 |
| NonU % | 2.3% | 1.9% | |

FIG. 1A

| Step CD | $CD_n$ | $CD_1$ | $CD_n - CD_1$ |
|---|---|---|---|
| AVERAGE (nm) | 607.6 | 608.4 | -0.8 |
| 3SIGMA (nm) | 21.5 | 14.0 | 23.1 |
| Max (nm) | 622.0 | 615.7 | 14.7 |
| Min (nm) | 593.9 | 592.3 | -16.8 |
| RANGE (nm) | 28.1 | 23.4 | 31.5 |
| NonU % | 2.3% | 1.9% | |

LOCAL AND GLOBAL REDUCTION OF CRITICAL DIMENSION (CD) ASYMMETRY IN ETCH PROCESSING

CROSS-REFERENCE TO RELATED APPLICATIONS

This application claims the benefit of U.S. Provisional Application No. 61/779,088, filed on Mar. 13, 2013, the entire contents of which are hereby incorporated by reference herein.

BACKGROUND

1) Field

Embodiments of the present invention pertain to the field of semiconductor processing and, in particular, to local and global reduction of critical dimension (CD) asymmetry in etch processing.

2) Description of Related Art

For pursuing the rapid integration density path of floating gate beyond the 10 nanometer (nm) generation, three-dimensional (3D) NAND devices are considered as the most promising near-term solution. The majority of the solutions presented nowadays use a deposited poly silicon (poly-Si) channel. Vertical NAND (VNAND) relies also on poly-Si channel devices and consists of a charge trapped device (CTF) with a vertical cylindrical geometry. The channel is made of an approximately 10 nm thick deposited poly-Si layer and the integration of such devices has already been proven. Recently, in order to keep a trend of increasing bit density and reducing bit cost of NAND flash memories, three-dimensional Bit-Cost Scalable (BiCS) flash technology has been proposed.

However, improvements are needed in the area of fabrication of VNAND and other three-dimensional based semiconductor structures and devices.

SUMMARY

One or more embodiments described herein is directed to local and global reduction of critical dimension (CD) asymmetry in etch processing.

In an embodiment, a method of etching a wafer of to form a plurality of staircase structures with reduced local and global asymmetry involves forming a photoresist layer on a plurality of micron-scale semiconductor structures. The method also involves trimming the photoresist layer with a high pressure plasma etch process, a pulsed plasma etch process, or a pulsed, high pressure plasma etch process.

In an embodiment, a method of etching a wafer of to form a plurality of staircase structures with reduced local and global asymmetry involves forming a photoresist layer on a plurality of micron-scale semiconductor structures. The method also involves trimming the photoresist layer with a plasma etch process performed in a reverse MESA mode.

In an embodiment, a non-transitory machine-accessible storage medium has instructions stored thereon which cause a data processing system to perform a method of etching a wafer of to form a plurality of staircase structures with reduced local and global asymmetry involving forming a photoresist layer on a plurality of micron-scale semiconductor structures. The method also involves trimming the photoresist layer with a high pressure plasma etch process, a pulsed plasma etch process, or a pulsed, high pressure plasma etch process.

In an embodiment, a non-transitory machine-accessible storage medium has instructions stored thereon which cause a data processing system to perform a method of etching a wafer of to form a plurality of staircase structures with reduced local and global asymmetry involving forming a photoresist layer on a plurality of micron-scale semiconductor structures. The method also involves trimming the photoresist layer with a plasma etch process performed in a reverse MESA mode.

DETAILED DESCRIPTION

Local and global reduction of critical dimension (CD) asymmetry in etch processing is described. In the following description, numerous specific details are set forth, such as specific plasma treatments and three-dimensional structures, in order to provide a thorough understanding of embodiments of the present invention. It will be apparent to one skilled in the art that embodiments of the present invention may be practiced without these specific details. In other instances, well-known aspects, such as photolithography patterning and development techniques for photoresist mask formation, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to methods of reducing CD symmetry within the wafer feature locally and within the wafer globally in etch.

To provide context, our own experimentation revealed asymmetry in CD for three-dimensional (3D) staircase structures for fabrication of vertical NAND (VNAND) devices. In particular, subsequent to etch structures had measurable asymmetry. For example, in one instance, on a same wafer location and a same CD measurement target, the CD of the left side of the staircase structure was determined to be different from the CD of the right side of the staircase structure. The CD asymmetry distribution on the wafer is closely related to the layout of the wafer structure. In cases where the staircase slit is open in a 0 to 6 o'clock direction (e.g., up/down direction), the CD exhibited asymmetry along the slit direction locally. On the whole wafer map, the CD is asymmetrical to the axis along the 0 to 6 o'clock direction at the wafer center. The right side of CD target, meanwhile, exhibited one distribution and was different from the left side of CD target distribution. In addition, the CD asymmetry is smaller near the wafer center and increase as closer to the wafer edge.

Conventional chamber designs involve CD tuning knobs to adjust the uniformity locally on the wafer. However, such tuning cannot adjust the CD difference on the left/right sides of the CD target. As such, embodiments of the present invention are targeted at understanding the root cause of the CD asymmetry and provide methods to reduce the CD asymmetry.

In a general example, the CD of an etch target is substantially defined by the mask which is typically composed of photoresist (PR) or similar functioning materials. In accordance with an embodiment of the present invention, it has been determined that the CDs are strongly influenced by a PR trim process operation which serves as the CD defining step of a staircase etch. For example, the PR trim in the lateral direction defines the staircase CD. The chemical reaction rate of a PR trim process involves balancing of the supply of reactants and the removal of the byproducts generated by the etch process. The transport of etch reacting species and the etch byproducts are strongly influenced by the pump design of the reaction chamber and its resulting flow pattern.

For a side pumping system, the reacting species are supplied from the gas source which is typical the top lid and flow from the center of the chamber to the edge of the chamber which is the pump or the pumping channel located. The etch byproducts are removed following the same pumping pattern. The final PR etch reaction rate is based on the balance of the supply of etching reacting species and byproduct removal. Any imbalance of the etching species supply or removal from the etching feature can contribute to the CD difference. For example, microscopically, on the same wafer location and the same CD measurement target location, it was determined that the CD of the left side of the staircase is different from the CD of the right side of the staircase. For a slit which is patterned by litho in the 0 to 6 o'clock direction, in the whole wafer map, the CD is asymmetrical to the axis along the 0 to 6 o'clock at the wafer center. The right side of CD target shows one distribution and is different from the left side of CD target distribution. The CD asymmetry, which is defined as the CD measured from the right side minus the CD measured from the left side, is used as a benchmark to measure the effectiveness of improvements to (i.e., reduction in) the CD asymmetry based on application of one or more embodiments described herein.

More specifically, embodiments of the present invention involve one of, or a combination of one or more of, at least four approaches to improving (i.e., reducing) CD asymmetry ways in a PR trim process. In a first aspect, in an embodiment, process pressure is increased to reduce CD asymmetry in a PR trim process. As described below, experimental data reveal a CD asymmetry at 90 mT or approximately 3.5 nm/1 sigma versus a CD imbalance at 10 mT of approximately 28.4 nm/1 sigma. Thus, a greater than 800% improvement in achieved. In a second aspect, in another embodiment, process flow is reduced or residence time is increased to reduce CD asymmetry in a PR trim process. The residence time is defined as P×V/Q where P represents pressure, V represents volume and Q represent process flow. In a third aspect, in another embodiment, pulsing in source or bias or together is used to reduce CD asymmetry in a PR trim process. As described below, an approach involves pulsing the source which is generated by 13.56 MHz inductively coupled plasma (ICP) plasma source. When a 10 KHz pulse is applied with 60% duty cycle, the CD asymmetry is 4.4 nm/1 sigma. Compared to the reference which does not involve a pulse source and exhibits 7.7 nm/1 sigma, a 43% improvement is achieved. In another embodiment, bias pulsing has a similar effect on CD asymmetry reduction. That is, a pulsing effect is helpful when bias pulsing or bias plus source pulsing is used as well. In a fourth aspect, in another embodiment, reverse mode in MESA source configuration is implemented to reduce CD asymmetry in a PR trim process. In an example described below, applying source in MESA reverse mode provides a CD asymmetry of approximately 3.7 nm/1 sigma versus using a source in the MESA standard mode which exhibits a CD asymmetry of approximately 7.7 nm/1 sigma. Thus, the reverse mode achieves approximately 50% CD asymmetry reduction. Thus, the advantages of embodiments of the present invention can rely on the application of unique features to solve the CD asymmetry, such as pulsing and MESA reverse mode, which are unique in the etch industry. It is to be understood that, in another embodiment, more than one of the above four aspects is used in combination to achieve reduction in CD asymmetry in a PR trim process.

Thus, in order to achieve CD asymmetry improvement, a root cause investigation was first performed. It relationship between wafer pattern interaction with chamber pumping pattern was determined. Embodiments to achieving reduction in CD asymmetry, e.g., in improving PR trim process improvement, involve one or more of (1) pressure effect: the use of high pressure instead of a relatively lower pressure; (2) source pulsing effect: e.g., 10 KHz source pulsing instead no pulsing; or (3) MESA reverse mode effect: reverse mode instead of standard mode.

Figure 1A:
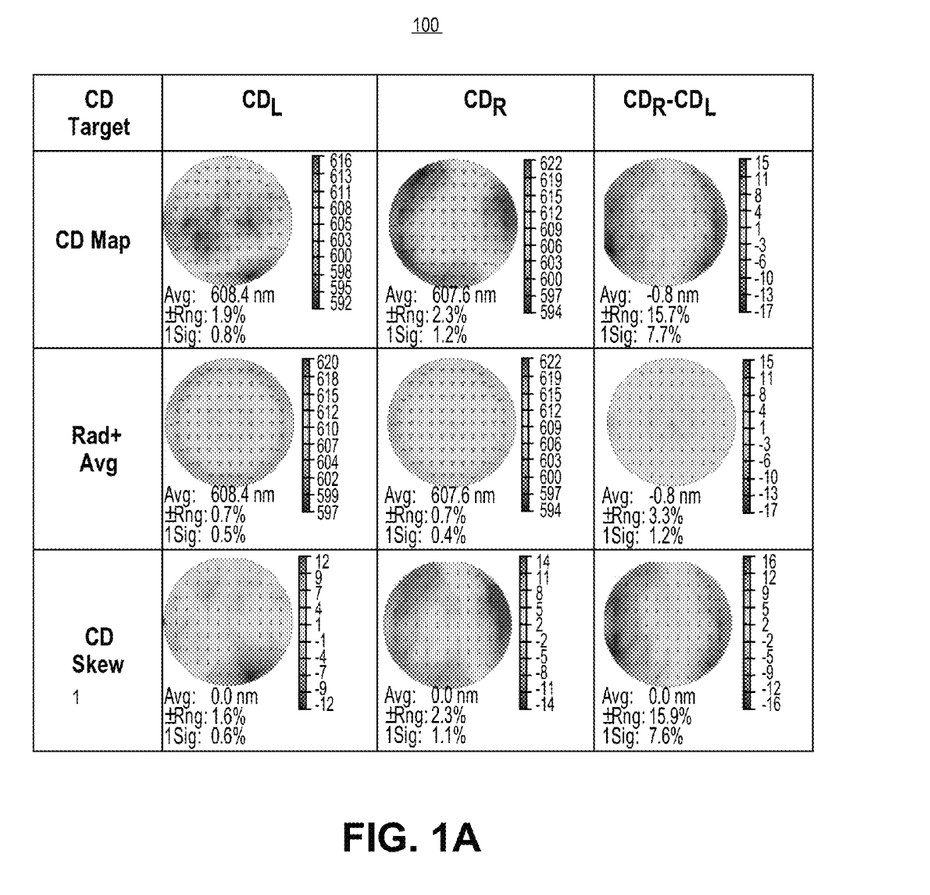
FIG. 1A is a plot of different CD maps on $CD_R$ vs. $CD_L$ that exhibits asymmetry in critical dimension (CD), in accordance with an embodiment of the present invention.
Figure 1B:
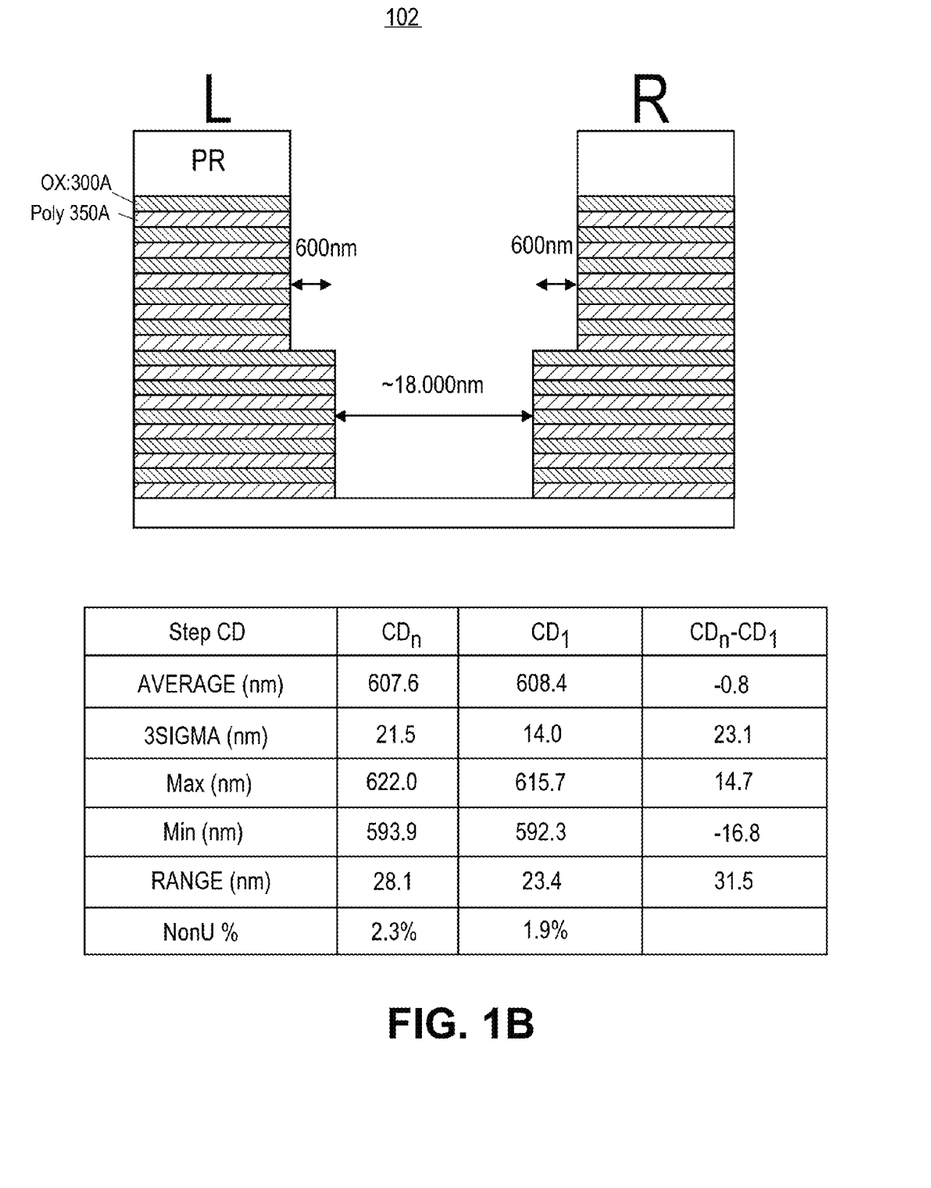
FIG. 1B illustrates a structure susceptible to CD asymmetry during etch along with a table of values corresponding to the plots of FIG. 1A, in accordance with an embodiment of the present invention.

FIG. 1A is a plot 100 of different CD maps on $CD_R$ vs. $CD_L$ that exhibits asymmetry in critical dimension (CD), in accordance with an embodiment of the present invention. FIG. 1B illustrates a structure 102 susceptible to CD asymmetry during etch along with a table of values corresponding to the plots of FIG. 1A, in accordance with an embodiment of the present invention. Referring to FIGS. 1A and 1B the issue is that $CD_R$ is different from $CD_L$. CD Delta of $CD_R$–$CD_L$ shows L/R asymmetry in the structure 102. Furthermore, it is shown that profiles are similar across the whole wafer. It was then determined that upon performing a wafer rotation CCW of 90 degrees, the L/R measured CDs are from Bottom/Top on wafer—R–L and have a delta pattern similar to a wafer with no rotation. Thus, in an embodiment, it is determined that flow is related to CD asymmetry. That is, since the CD asymmetry of $CD_R$–$CD_L$ also rotates 90 degree with wafer 90 rotation, it is herein determined that asymmetry is caused by radial flow pattern. Fundamentally, then, structure 102 (having approximately 18 micron spacing) has issues with pumping flow. The feature size related to such issues is, in an embodiment, a block region micron-scale sizing and spacing with real shadowing effects. In a specific embodiment, understanding and resolving such issues is directly application to PR trimming for forming staircase structures on such a relatively large scale.

Figure 2:
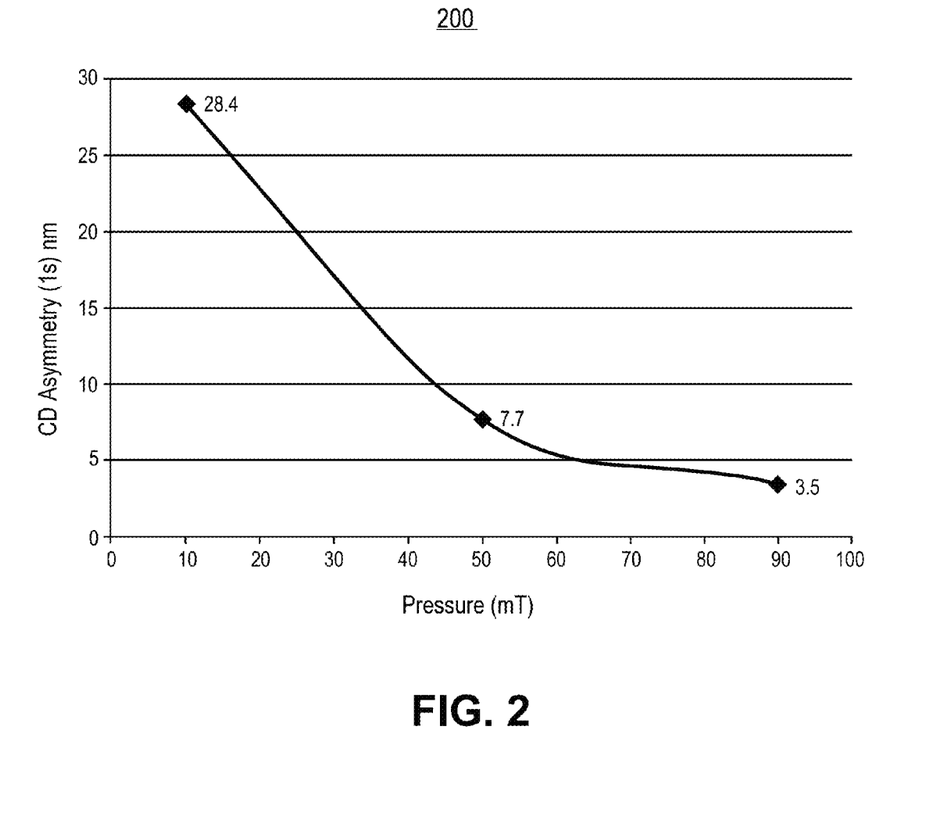
FIG. 2 is a plot of CD asymmetry (in nanometers) versus etch pressure (in mTorr), in accordance with an embodiment of the present invention.

FIG. 2 is a plot 200 of CD asymmetry (in nanometers) versus etch pressure (in mTorr), in accordance with an embodiment of the present invention. Referring to plot 200, a PR trim pressure effect is exhibited for CD asymmetry. In particular, high pressure shows much better CD asymmetry (9×pressure=8×CD variation reduction).

Figure 3:
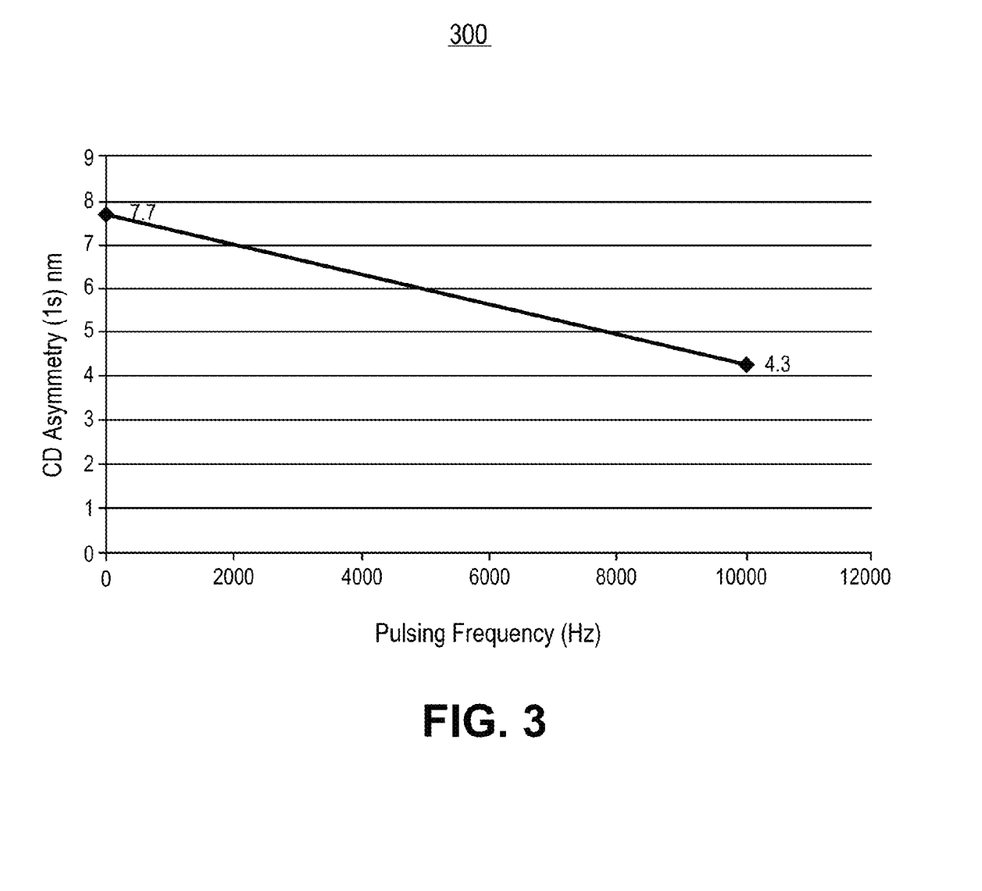
FIG. 3 is a plot of CD asymmetry (in nanometers) versus etch pulsing frequency (in Hz), in accordance with an embodiment of the present invention.

FIG. 3 is a plot 300 of CD asymmetry (in nanometers) versus etch pulsing frequency (in Hz), in accordance with an embodiment of the present invention. Referring to plot 300, a PR trim pulsing effect is exhibited for CD asymmetry. In particular, pulsing improves CD asymmetry by approximately 42%. That is, source pulsing shows much improved CD asymmetry.

Figure 4:
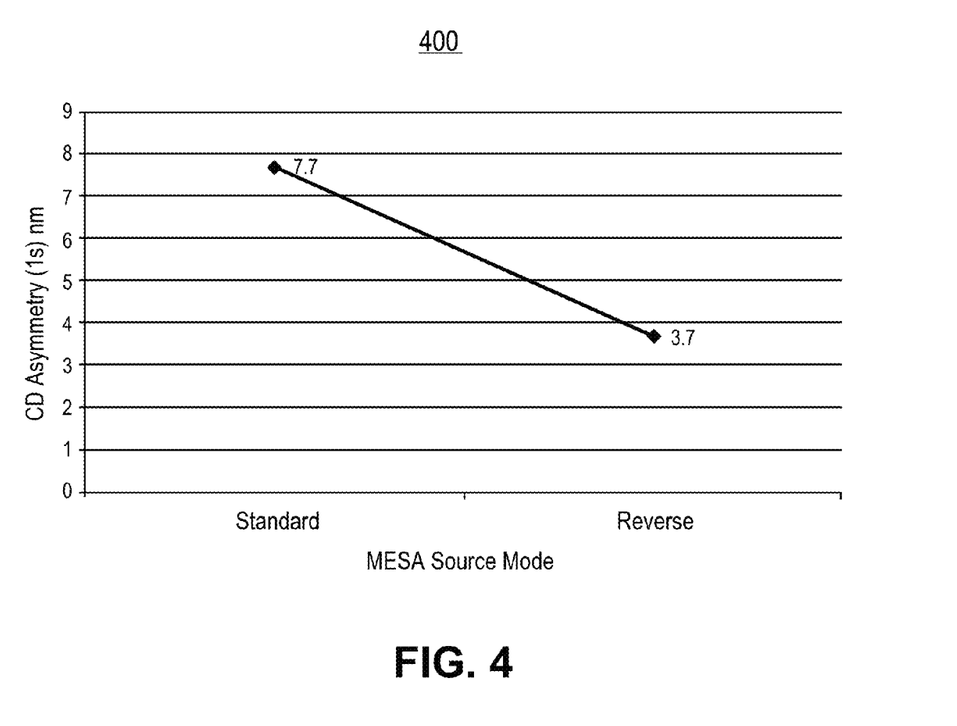
FIG. 4 is a plot of CD asymmetry (in nanometers) versus MESA source mode, in accordance with an embodiment of the present invention.

FIG. 4 is a plot 400 of CD asymmetry (in nanometers) versus MESA source mode, in accordance with an embodiment of the present invention. Referring to plot 400, a PR trim MESA mode effect is exhibited for CD asymmetry. In particular, Mesa reverse mode improves CD asymmetry by approximately 50%. In general, MESA has an inner coil and an outer coil. Here, in a reverse mode, current is flowed out of phase such that the outer coil has increased plasma density versus the inner portion of the plasma. This is opposite to standard mode for MESA.

Overall, in an embodiment, it is determined that CD asymmetry is caused by the interaction of wafer pattern orientation and the chamber pumping flow pattern. Embodiments can involve minimizing CD asymmetry with process parameters such as pressure, source pulsing/pulsed plasma and MESA reverse mode (any of which can be performed individually or in combination). Applications include, but are not limited to, etch processing of vertical NAND or other processing schemes involving staircase structure fabrication on a relatively large feature dimension scale where CD imbalance is observed.

Local and global reduction of CD asymmetry in etch processing may be conducted in processing equipment suitable to provide an etch plasma in proximity to a sample for etching. For example, FIG. 5 illustrates a system in which a method of local and global reduction of CD asymmetry in etch processing can be performed, in accordance with an embodiment of the present invention.

Figure 5:
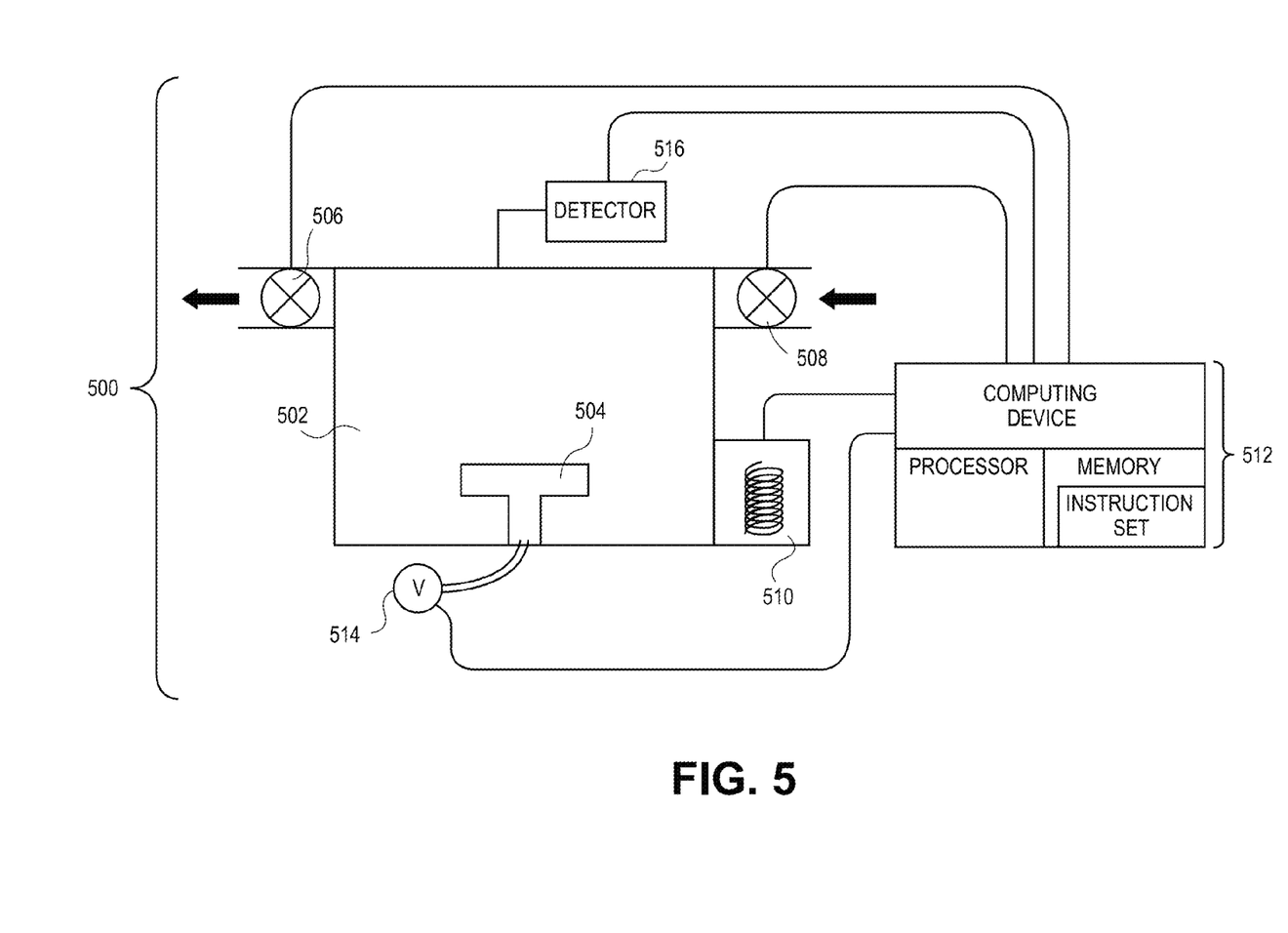
FIG. 5 illustrates a system in which a method of local and global reduction of critical dimension (CD) asymmetry in etch processing can be performed, in accordance with an embodiment of the present invention.

Referring to FIG. 5, a system 500 for conducting a plasma etch process includes a chamber 502 equipped with a sample holder 504. An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 904 and a detector 516 coupled with chamber 502. Computing device 512 may also be coupled with evacuation device 506, gas inlet device 508, voltage source 514 and detector 516, as depicted in FIG. 5.

Chamber 502 and sample holder 504 may include a reaction chamber and sample positioning device suitable to contain an ionized gas, i.e. a plasma, and bring a sample in proximity to the ionized gas or charged species ejected there from. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, an Applied Materials® Conductor MESA etch chamber or related chambers used on an Applied Materials® AdvantEdge system.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
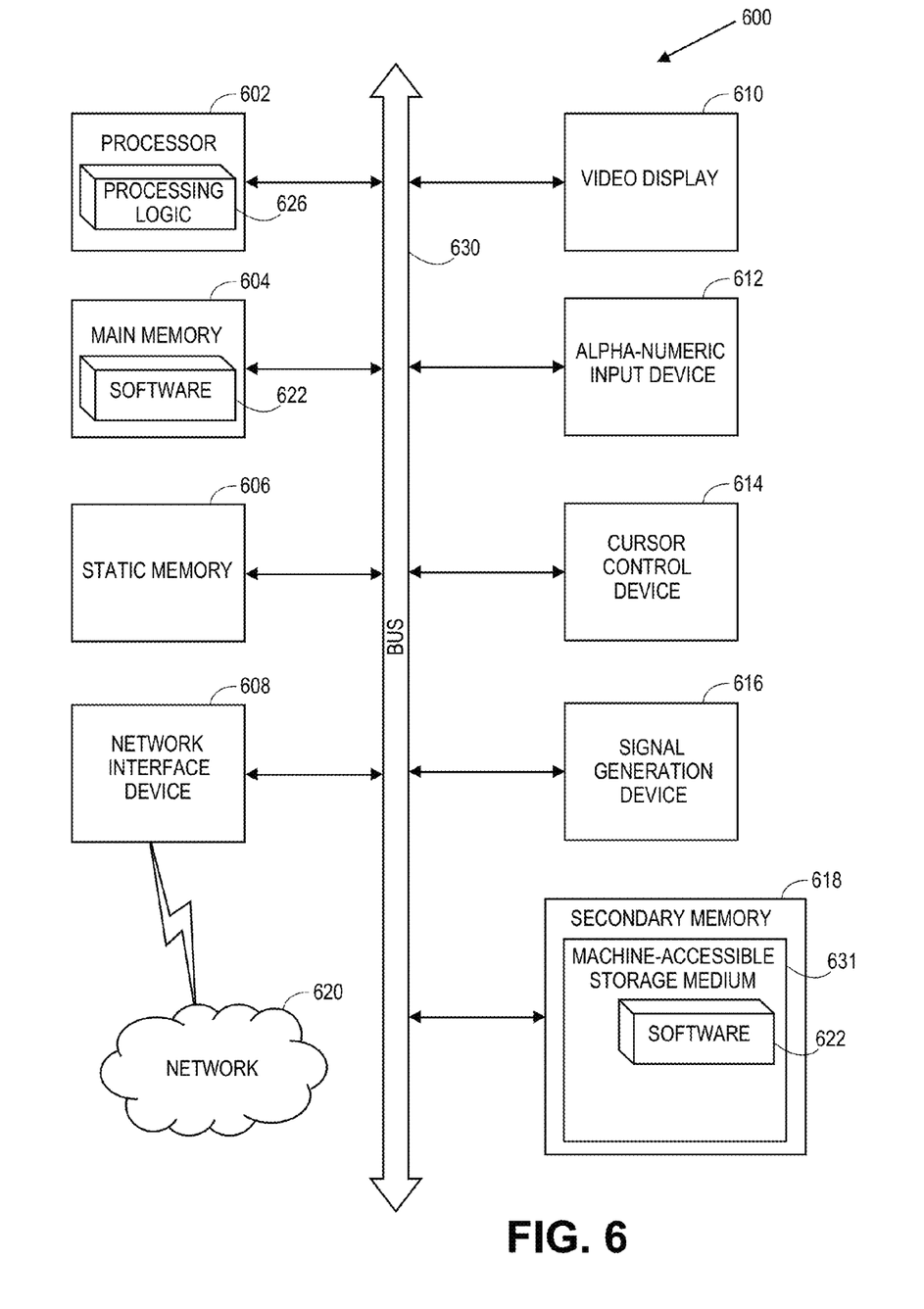
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use as computing device 512 described in association with FIG. 5.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a non-transitory machine-accessible storage medium has instructions stored thereon which cause a data processing system to perform a method of etching a wafer of to form a plurality of staircase structures with reduced local and global asymmetry. The method involves forming a photoresist layer on a plurality of micron-scale semiconductor structures. The photoresist layer is then trimmed with a high pressure plasma etch process.

In accordance with an embodiment of the present invention, a non-transitory machine-accessible storage medium has instructions stored thereon which cause a data processing system to perform a method of etching a wafer of to form a plurality of staircase structures with reduced local and global asymmetry. The method involves forming a photoresist layer on a plurality of micron-scale semiconductor structures. The photoresist layer is then trimmed with a pulsed plasma etch process.

In accordance with an embodiment of the present invention, a non-transitory machine-accessible storage medium has instructions stored thereon which cause a data processing system to perform a method of etching a wafer of to form a plurality of staircase structures with reduced local and global asymmetry. The method involves forming a photoresist layer on a plurality of micron-scale semiconductor structures. The photoresist layer is then trimmed with a plasma etch process performed in a reverse MESA mode.

In accordance with an embodiment of the present invention, a non-transitory machine-accessible storage medium has instructions stored thereon which cause a data processing system to perform a method of etching a wafer of to form a plurality of staircase structures with reduced local and global asymmetry. The method involves forming a photoresist layer on a plurality of micron-scale semiconductor structures. The photoresist layer is then trimmed with a high pressure and pulsed plasma etch process performed in a reverse MESA mode.

Figure 7:
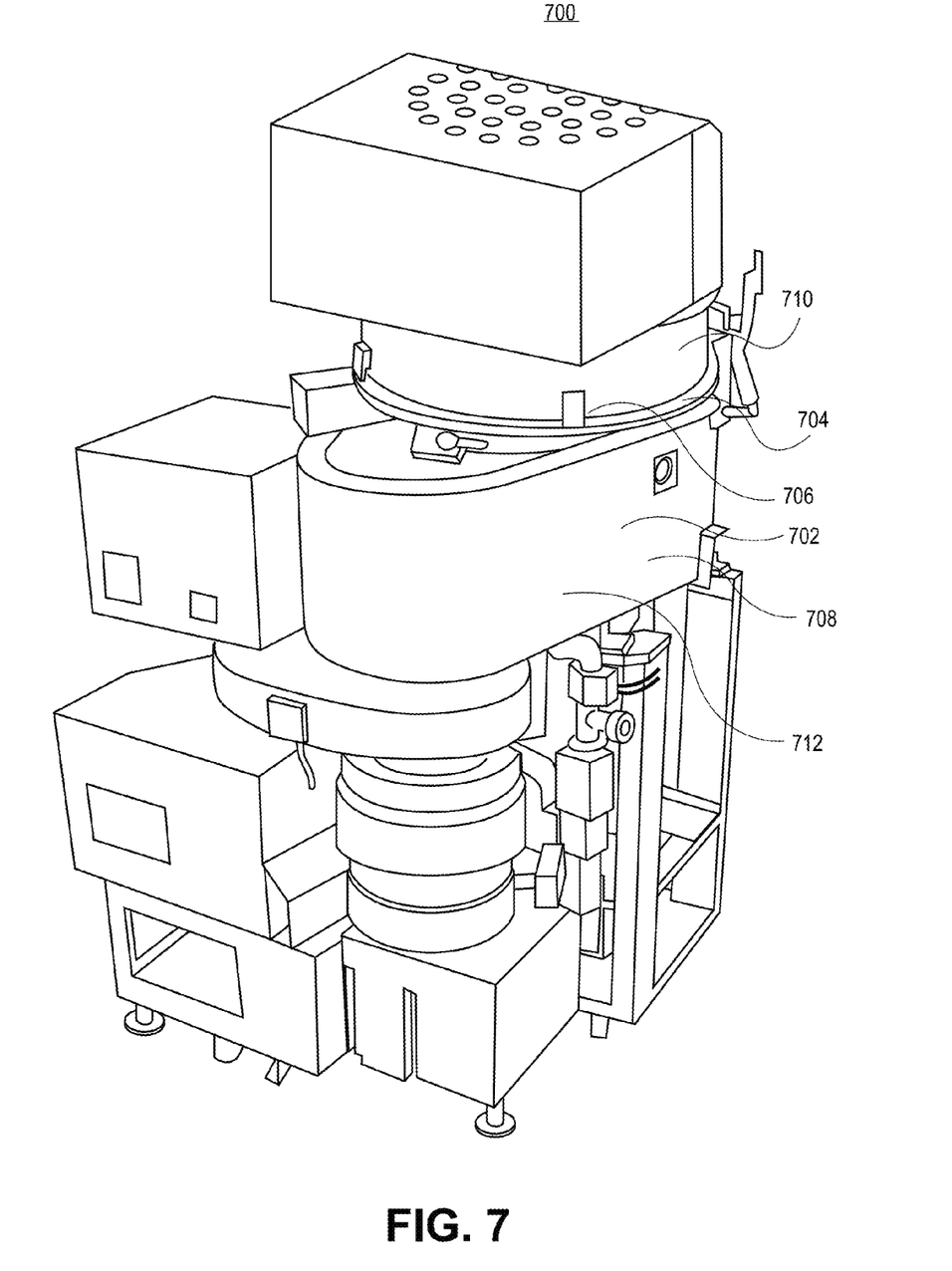
FIG. 7 is a schematic of an AdvantEdge™ Mesa™ Hardware Configuration, in accordance with an embodiment of the present invention.

FIG. 7 is a schematic of an AdvantEdge™ Mesa™ Hardware Configuration, in accordance with an embodiment of the present invention. In one embodiment, the hardware configuration 700 includes one or more of a G3.9 electrostatic chuck (ESC) 702, Yttria liners with HPM lid 704, an O-shaped heater 706, Apex generators, an Ytrria FE 708, a Mesa inductively coupled plasma (ICP) source 710, a G5 Minos Center RF Feed Cathode 712, or a phase shifter, with phase adjusted to approximately 15 nsec.

In an embodiment, a Mesa Reverse mode is an RF mode that exhibits different plasma properties from a standard mode. In one such embodiment, reverse mode is used to eliminate M-shape and/or to control extreme edge profile tilting. In reverse mode, higher source power is needed to achieve similar etch rate (ER) versus in standard mode due to the nature of the RF power coupling in reverse mode. In a particular embodiment, as a starting point, the source power is at least double as that used in Mesa standard mode the Div Cap is set to around 1:1 current ratio (as long as this is within the allowed window of operation for stable and reliable plasma). In one embodiment, since reverse mode exhibits different plasma properties, chemistry may need to be tuned to accommodate reverse mode.

Figure 8:
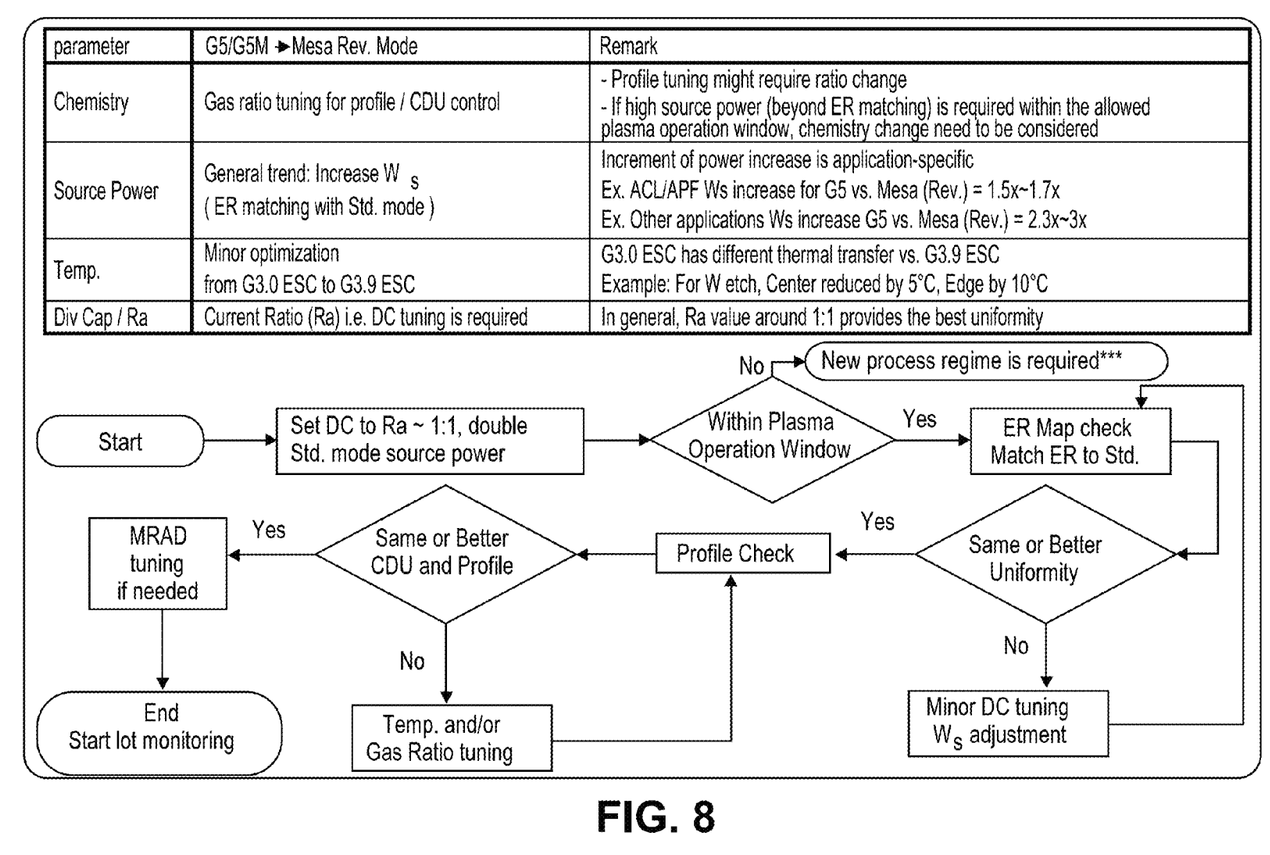
FIG. 8 is a diagram of process improvement guidelines for a Mesa Reverse Mode, in accordance with an embodiment of the present invention.

FIG. 8 is a diagram of process improvement guidelines for a Mesa Reverse Mode, in accordance with an embodiment of the present invention.

Thus, local and global reduction of critical dimension (CD) asymmetry in etch processing has been disclosed.

What is claimed is:

1. A method of etching a wafer of to form a plurality of staircase structures with reduced local and global asymmetry, the method comprising:
    forming a photoresist layer on a plurality of micron-scale semiconductor structures; and
    trimming the photoresist layer with a plasma etch process performed in a reverse MESA mode.

2. The method of claim 1, wherein the plasma etch process is a high pressure plasma etch process performed at a pressure of approximately 90 mTorr.

3. The method of claim 1, wherein the plasma etch process is a pulsed plasma etch process performed with an approximately 10 KHz pulse with an approximately 60% duty cycle.

4. The method of claim 1, wherein the plasma etch process is a pulsed, high pressure plasma etch process performed at a pressure of approximately 90 mTorr, with an approximately 10 KHz pulse having an approximately 60% duty cycle.

5. The method of claim 1, further comprising:
    subsequent to trimming the photoresist layer, etching layers of a vertical NAND device using a pattern of the trimmed photoresist.

6. A method of etching a wafer of to form a plurality of staircase structures with reduced local and global asymmetry, the method comprising:
    forming a photoresist layer on a plurality of micron-scale semiconductor structures;
    trimming the photoresist layer with a plasma etch process performed in a reverse MESA mode, wherein the plasma etch process is a high pressure plasma etch process performed at a pressure of approximately 90 mTorr; and
    subsequent to trimming the photoresist layer, etching layers of a vertical NAND device using a pattern of the trimmed photoresist.

7. The method of claim 6, wherein the plasma etch process is a pulsed plasma etch process performed with an approximately 10 KHz pulse with an approximately 60% duty cycle.

8. A method of etching a wafer of to form a plurality of staircase structures with reduced local and global asymmetry, the method comprising:
- forming a photoresist layer on a plurality of micron-scale semiconductor structures;
- trimming the photoresist layer with a plasma etch process performed in a reverse MESA mode, wherein the plasma etch process is a pulsed plasma etch process performed with an approximately 10 KHz pulse with an approximately 60% duty cycle; and
- subsequent to trimming the photoresist layer, etching layers of a vertical NAND device using a pattern of the trimmed photoresist.

\* \* \* \* \*